(12) United States Patent
Penney et al.

(10) Patent No.: US 6,329,867 B1
(45) Date of Patent: *Dec. 11, 2001

(54) CLOCK INPUT BUFFER WITH NOISE SUPPRESSION

(75) Inventors: Daniel B. Penney, Houston; William C. Waldrop; Jason M. Brown, both of Stafford, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/390,741

(22) Filed: Sep. 7, 1999

Related U.S. Application Data
(60) Provisional application No. 60/102,205, filed on Sep. 29, 1998, and provisional application No. 60/044,914, filed on Apr. 25, 1997.

(51) Int. Cl.[7] .......................... H03K 17/28; H03K 17/296
(52) U.S. Cl. ...................... 327/392; 327/394; 327/291; 327/175; 327/108; 326/121; 326/83; 326/56
(58) Field of Search .................... 327/291, 293, 327/113, 114, 115, 116, 119, 122, 172, 173, 176, 174–175, 392–394, 398–401, 143, 108; 326/56–58, 95–97, 82, 83, 86, 87, 119, 121; 365/189.06

(56) References Cited

U.S. PATENT DOCUMENTS

| | | | |
|---|---|---|---|
| 3,914,702 | * 10/1975 | GehWeiler | 326/121 |
| 4,758,737 | * 7/1988 | Hirano | 327/291 |
| 4,825,106 | * 4/1989 | Tipon et al. | 326/121 |
| 5,065,054 | * 11/1991 | Nguyen et al. | 327/311 |
| 5,517,133 | * 5/1996 | Sandhu | 326/121 |
| 5,541,528 | * 7/1996 | Montoye et al. | 326/121 |
| 5,550,499 | * 8/1996 | Eitrheim | 327/175 |
| 5,633,607 | * 5/1997 | Millar | 327/294 |
| 5,808,486 | * 9/1998 | Smiley | 327/294 |
| 5,886,562 | * 3/1999 | Garrity et al. | 327/99 |
| 5,955,893 | * 9/1999 | Chang et al. | 326/121 |
| 6,005,432 | * 12/1999 | Guo et al. | 326/83 |
| 6,023,177 | * 2/2000 | Kim et al. | 327/291 |
| 6,023,181 | * 2/2000 | Penney et al. | 327/291 |
| 6,094,080 | * 7/2000 | Jeong et al. | 327/176 |

* cited by examiner

*Primary Examiner*—Terry D. Cunningham
*Assistant Examiner*—Long Nguyen
(74) *Attorney, Agent, or Firm*—Robert N. Rountree; Wade James Brady, III; Frederick J. Telecky, Jr.

(57) ABSTRACT

A circuit is designed with a delay circuit (300) coupled to receive a clock input signal (CLK) and a control signal (DFT). The control signal has a first logic state and a second logic state. The delay circuit produces a clock control signal (*CLK) at a first time in response to the first logic state and at a second time in response to the second logic state. A clock circuit (200) is coupled to receive the clock input signal and is enabled by the clock control signal. The clock circuit produces a first clock pulse signal having a predetermined width in response to a first transition of the clock input signal and produces a second clock pulse signal having the predetermined width in response to a second transition of the clock input signal.

30 Claims, 4 Drawing Sheets

CLOCK INPUT BUFFER WITH NOISE SUPPRESSION

This application claims priority under 35 USC § 119(e)(1) of provisional application No. 60/102,205, filed Sep. 29, 1998, provisional application No. 60/044,914, filed Apr. 25, 1997, and under 35 USC § 120 of nonprovisional application No. 09/039,012, filed Mar. 13, 1998, now U.S. Pat. No. 6,023,181.

FIELD OF THE INVENTION

This invention relates to an integrated circuit and more particularly to an integrated circuit with a clock input buffer circuit.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology require ever increasing clock rates and memory bus widths to achieve high data rates. Both of these methods, impose equally demanding limitations on memory testers that must guarantee functionality of the memory circuits under all conditions. Moreover, these memory testers must simultaneously test many of the SDRAM memory circuits in order to meet production quotas. These simultaneous tests, however, impose parasitic loads having substantial capacitance and inductance on drive circuits of the memory tester. Consequently, these parasitic loads greatly slow rise and fall times of test waveforms applied to the memory circuits. In many cases, a slow transition time of these test waveforms may induce internal oscillation of the memory clock and control signals leading to erroneous memory circuit test failures.

A clock input buffer circuit (FIG. 5) of U.S. patent application Ser. No. 09/039,012, filed Mar. 13, 1998, now U.S. Pat. No. 6,023,181, issued Feb. 8, 2000, produces a clock pulse signal IOCLK having a rising edge or transition two gate delays after a rising edge of clock input signal CLK. This rising edge turns off transistors 221 and 227, thereby disabling a first inverter of the two gate delays. Inverter 231 applies an inverted clock pulse signal at an input terminal of delay circuit 235. Delay circuit 235 produces a low output signal after a predetermined delay, thereby turning on transistor 245 and driving terminal 229 high. This high level at the input terminal of inverter 253, the second of the gate delays, drives clock pulse signal IOCLK low again. A significant problem occurs with this clock input buffer circuit, however, when noise on clock input signal CLK causes a subsequent low-high-low transition. This low-high-low transition propagates directly through the clock input buffer circuit to clock pulse signal IOCLK, since the clock input buffer is immediately enabled by a falling edge of clock input signal CLK. This false transition causes erroneous memory circuit test failure when internal operation of the memory circuit is no longer synchronized with the memory tester.

SUMMARY OF THE INVENTION

These problems are resolved by a circuit, comprising a delay circuit coupled to receive a clock input signal and a control signal. The control signal has a first logic state and a second logic state. The delay circuit produces a clock control signal at a first time in response to the first logic state and at a second time in response to the second logic state. A clock circuit is coupled to receive the clock input signal and is enabled by the clock control signal. The clock circuit produces a clock pulse signal having a predetermined width in response to a transition of the clock input signal.

The present invention provides minimal delay between the clock input signal and the first clock pulse signal. Erroneous clock pulse signals are precluded by the clock control signal.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
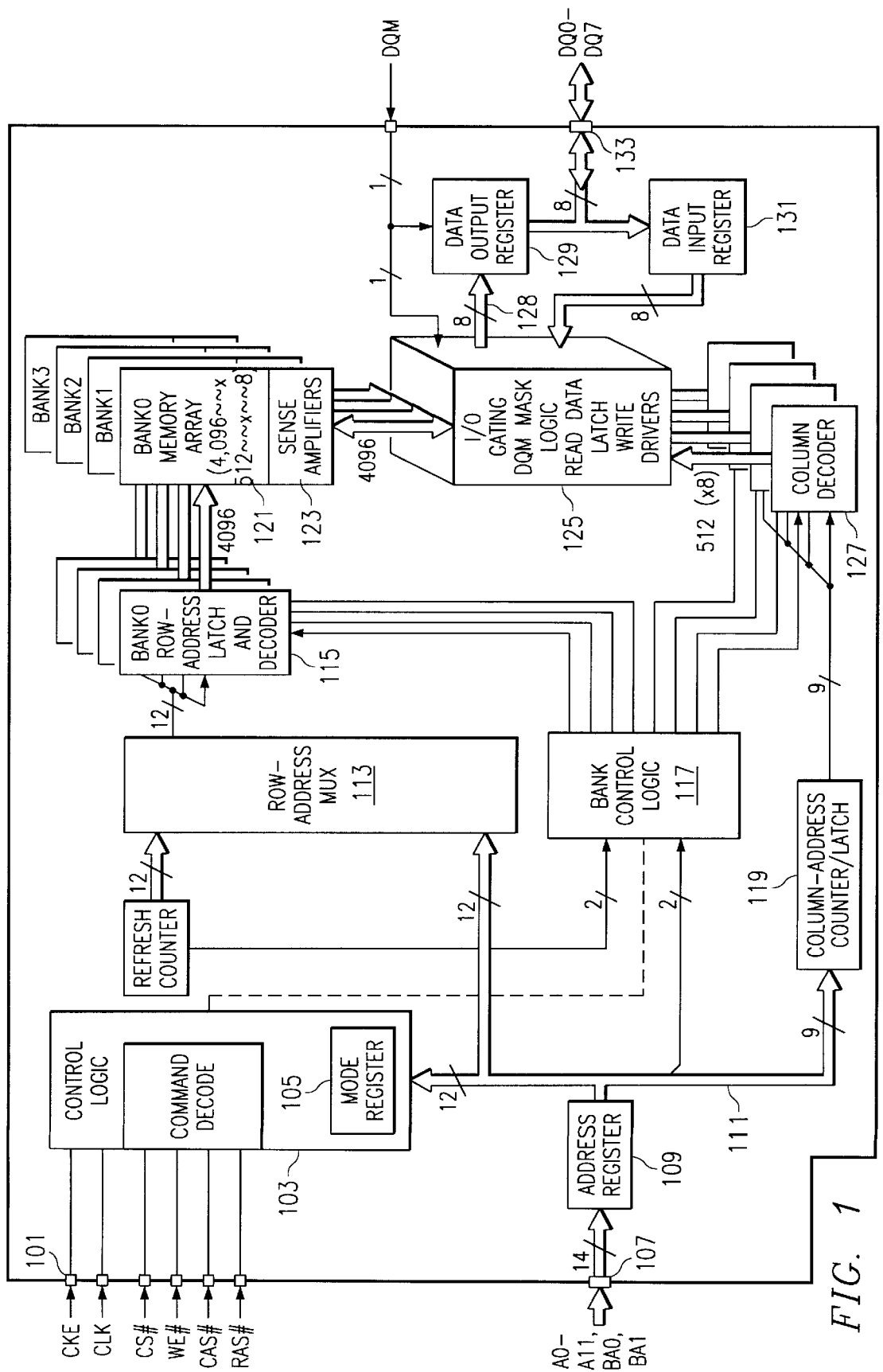
FIG. 1 is a functional block diagram of a memory circuit that may employ a clock input buffer according to the present invention.

Referring now to FIG. 1, there is a functional block diagram of a memory circuit that may employ internal clock input buffer according to the present invention. A control logic section 103 of the memory circuit receives control signals including clock enable signal CKE, system clock signal CLK, row address strobe RAS# and column address strobe CAS# at terminals 101 for controlling operation of the memory circuit. Address register 109 receives address signals A0-A11 and bank address signals BA0 and BA1 at terminals 107. During normal operation, the bank address signals are applied to bank control logic 117 for activating a bank of memory cells 121. Each bank of memory cells is arranged in rows and columns or X and Y dimensions of memory cells. The memory circuit is further arranged in four banks or a Z dimension. The row address signals are applied to respective row address latch and decode circuits 115 via row address mux 113 for selecting a word line within an active bank of memory cells. The column address signals are applied to column address counter and latch circuit 119. The column address counter loads an initial column address and produces a sequence of address signals in synchronization with the system clock signal during burst read and write modes of operation. This sequence of addresses is applied to column decode circuit 127 for selecting memory cells from a selected word line of an active bank. These selected memory cells produce or receive data bits via data output register 129 or data input register 131, respectively, at data terminals 133.

Figure 2:
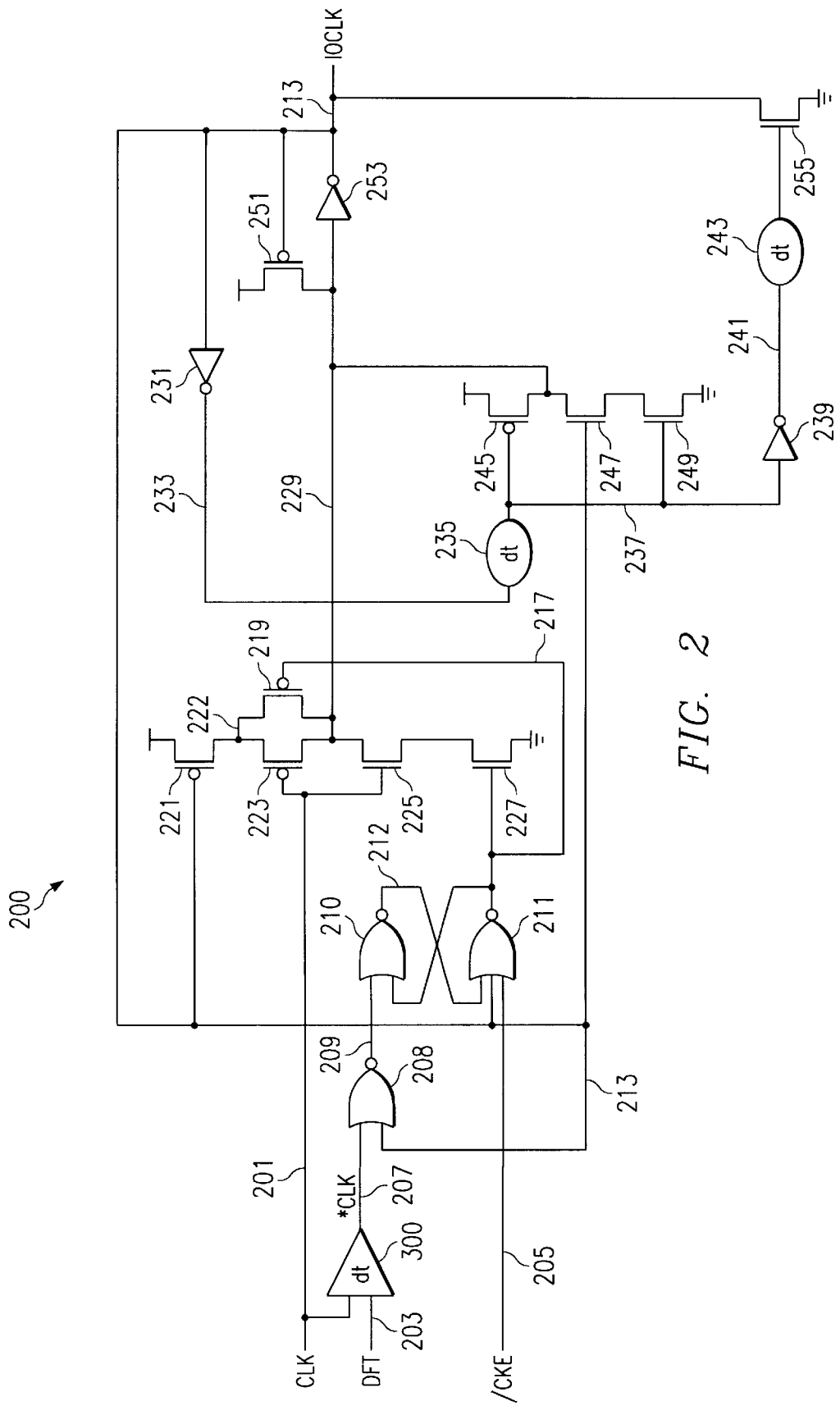
FIG. 2 is a schematic diagram of a clock input buffer of the present invention.

Turning now to FIG. 2, a clock input buffer with noise suppression will be explained in detail. The clock input buffer receives clock input signal CLK at terminal 201 and complementary clock enable signal /CKE at terminal 205. During normal operation, both and complementary clock enable signal /CKE and control signal DFT are low. During a parallel test mode, however, control logic section 103 generates a high-level control signal DFT at terminal 203. This high-level control signal DFT enables a greatly increased delay path of delay circuit 300, thereby implementing a noise suppression feature of the instant invention.

In parallel test mode operation, clock input signal CLK, complementary clock enable signal /CKE and clock pulse signal IOCLK are initially low and control signal DFT is high. In this state, both input signals of NOR gate 208 are low and the output signal at lead 209 is high. This high output signal sets a latch formed by cross-coupled NOR gates 210 and 211 so that the signal on lead 217 is high. Thus, transistors 221 and 227 are initially on and transistor 219 is initially off. In this initial state, therefore, a first tristate inverter formed by transistors 221, 223, 225 and 227 produces a high-level output signal on lead 229 and is enabled to receive a low-to-high transition of clock input signal CLK. Moreover, a second tristate inverter formed by transistors 245, 247 and 249 is disabled by the low level of clock pulse signal IOCLK on lead 213 and the corresponding high level of its complement on lead 237.

A low-to-high transition of clock input signal CLK is inverted once by the first tristate inverter and again by inverter 253, thereby producing a low-to-high transition of clock pulse signal IOCLK two gate delays after clock input signal CLK. This minimal delay is highly advantageous in minimizing access time for memory circuit operations, including input-output circuit operations, that are controlled by clock input signal CLK.

The high level of clock pulse signal IOCLK disables the first tristate inverter and enables the second tristate inverter in the following manner. The high level of clock pulse signal IOCLK immediately turns off transistor 221 of the first tristate inverter. This high level is inverted by NOR gate 211 to produce a low level on lead 217, thereby turning off transistor 227. Furthermore, the high level of clock input signal CLK produces a high-level clock control signal *CLK on lead 207 after two gate delays as will be explained in detail. The high level of clock control signal *CLK is applied to NOR gate 208, producing a low level on lead 209. This low level on lead 209 together with the high level of clock pulse signal IOCLK resets the latch formed by cross-coupled NOR gates 210 and 211. Thus, the clock input buffer is temporarily precluded by the clock control signal *CLK from propagating any further transitions of clock input signal CLK. The low level on lead 217 turns on transistor 219, thereby maintaining a high level on lead 222. This high level on the source of transistor 223 ensures that clock input signal CLK must fall at least one P-channel transistor threshold voltage below a level on lead 229 before the first tristate inverter will conduct.

The second tristate inverter is enabled when the high level of clock pulse signal IOCLK turns on transistor 247. This establishes a current path through transistors 247 and 249, thereby maintaining a low level on lead 229. Delay circuit 235 produces a delayed inversion of clock pulse signal IOCLK on lead 237 after a pulse width delay. This inversion of clock pulse signal IOCLK on lead 237 turns on transistor 245 and turns off transistor 249, thereby driving lead 229 high. This high level is inverted by inverter 253 to initiate a high-to-low transition of clock pulse signal IOCLK. The high-to-low transition is completed when inverter 239 turns on transistor 255 via delay circuit 243. The resulting low level of clock pulse signal IOCLK turns on feedback transistor 251, thereby latching the low level. The low level immediately turns on transistor 221 of the first tristate inverter. The first tristate inverter, however, is temporarily disabled from accepting a subsequent low to high transition of clock input signal CLK, until transistor 227 is turned on.

Figure 4:
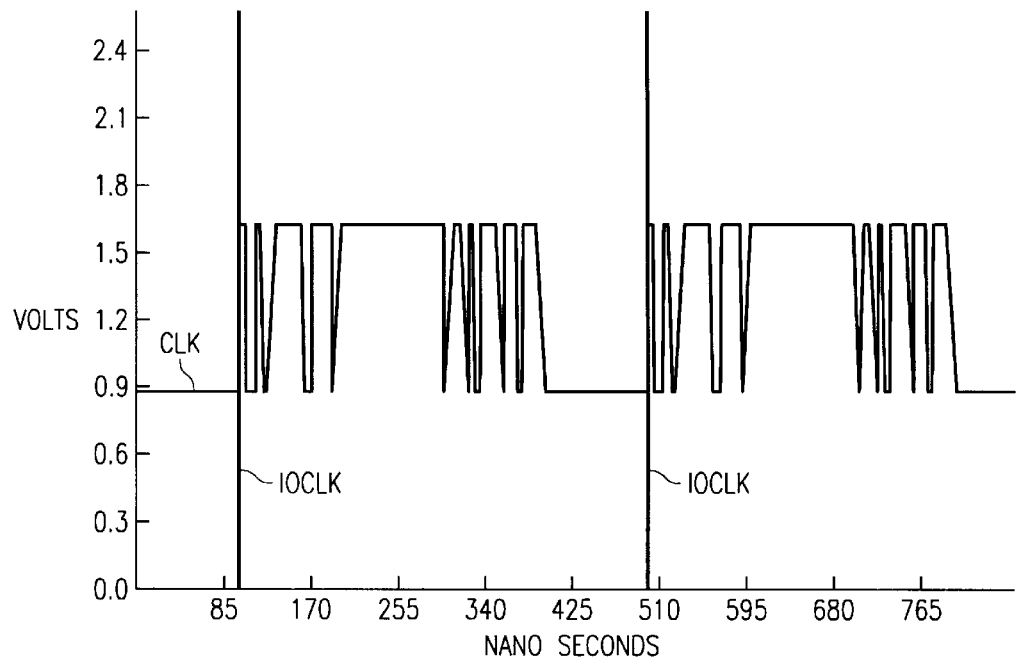
FIG. 4 is a simulation of a clock input signal with noise and a clock pulse signal.
Figure 5:
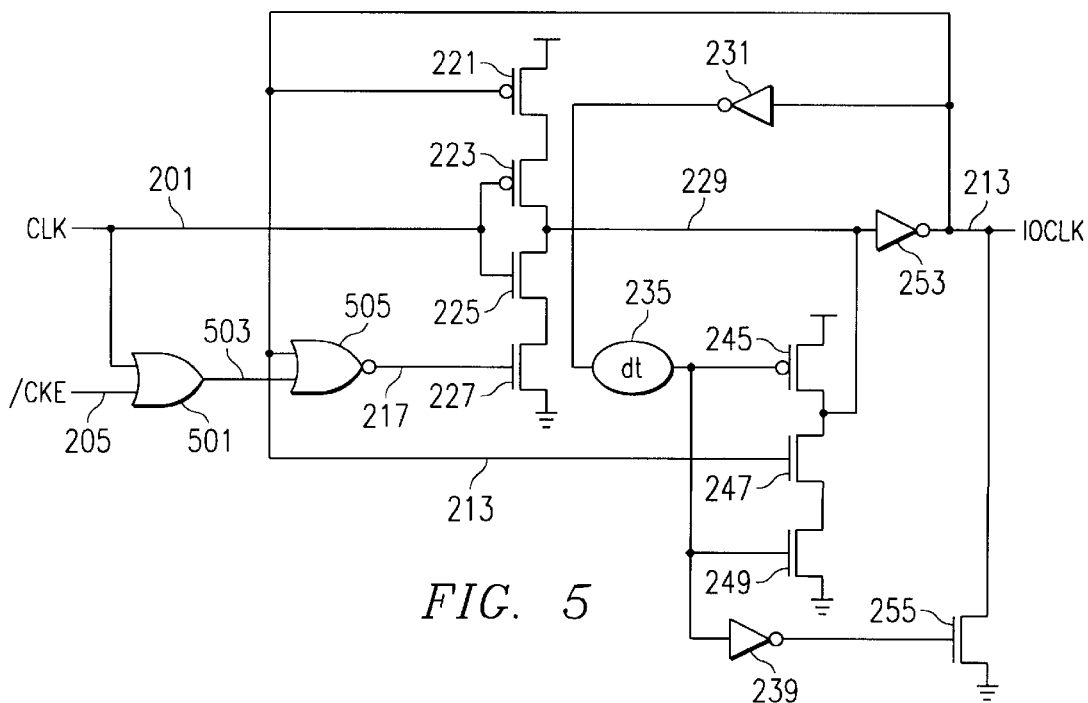
FIG. 5 is a clock input buffer.

This temporary disability is highly advantageous in preventing subsequent clock input transitions due to noise from propagating to internal circuits and causing erroneous test failures. The simulation of FIG. 4 shows clock input signal CLK fluctuating between 0.8 V and 1.6 V. A first low-to-high transition at 100 nanoseconds produces a corresponding clock pulse signal IOCLK having a pulse width of preferably 4 nanoseconds as determined by delay stage 235. Subsequent transitions of clock input signal CLK due to simulated noise are rejected by the clock input buffer circuit while transistor 227 remains off. Transistor 227 (FIG. 2) remains off until clock input signal CLK remains low for a time determined by delay circuit 300. After this predetermined delay time, the low level of clock input signal CLK propagates to clock control signal *CLK at lead 207. This low level at lead 207 together with the low level of clock pulse signal IOCLK produces a high level on lead 209 from NOR gate 208. This high level sets the latch formed by cross-coupled NOR gates 210 and 211 and produces a high level on lead 217. This high level on lead 217 turns on transistor 227 and turns off transistor 219, thereby enabling the first tristate inverter for a next low-to-high transition of clock input signal CLK.

Figure 3:
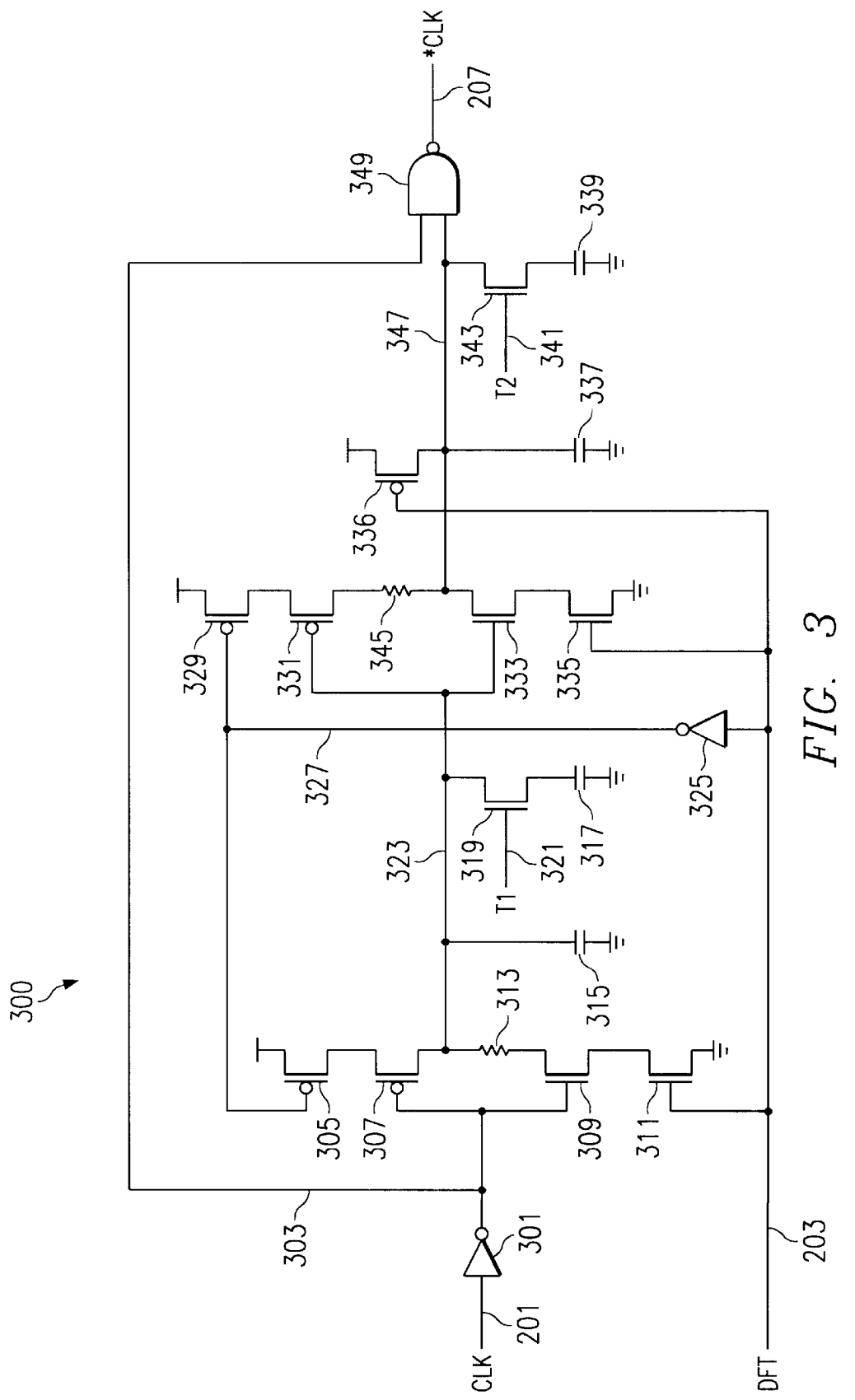
FIG. 3 is a schematic diagram of a delay circuit of the clock input buffer of FIG. 2.

Referring now to FIG. 3A and FIG. 3B, operation of the delay circuit 300 will be described in detail. Delay circuit 300 includes a first tristate inverter formed by transistors 305, 307, 309 and 311 and a second tristate inverter formed by transistors 329, 331, 333 and 335. These tristate inverters are connected in series between input inverter 301 and output NAND gate 349. In normal operation, control signal DFT is low 350. This low level turns off transistors 311 and 335 and turns on transistor 336. Inverter 325 produces a corresponding high level on lead 327 for turning off transistors 305 and 329. These respective low and high levels disable the first and second tristate inverters. Furthermore, transistor 336 maintains a high level on lead 347 so that NAND gate 349 is enabled. During normal operation, therefore, any transition 352, 354 of clock input signal CLK is inverted twice by the series combination of inverter 301 and NAND gate 349 to produce clock control signal *CLK 356, 358 after two gate delays of preferably less than 2 nanoseconds.

In parallel test mode operation, control circuit 103 produces a high level control signal DFT 351. Control circuit 103 includes a two-bit register that is programmed to store a logic state of delay signals T1 and T2 at leads 321 and 341, respectively. These delay signals selectively couple respective capacitors 317 and 339 to leads 323 and 347, thereby selectively increasing the capacitive load on the leads. This programmable capacitive load provides a significant advantage of adjusting the delay period of delay circuit 300 to account for differences in memory testers and test conditions. For the purpose of the following discussion, however, delay signals T1 and T2 are low.

The high level control signal DFT 351 turns off transistor 336 and enables the first and second tristate inverters. In this state, a low-to-high transition 362 of clock input signal CLK still propagates to clock control signal *CLK 364 in two gate delays through inverter 301 and NAND gate 349. A high-to-low transition 370, however, produces a high level on lead 303 that must propagate through the delay of the tristate inverters so that both input signals of NAND gate 349 are high before clock control signal *CLK will go low 372. The high level on lead 303 turns on transistor 309, thereby providing a current path through resistor 313 and transistor 311 for discharging capacitor 315. The discharge of capacitor 315 delays the high-to-low transition of the signal on lead 323 applied to the second tristate inverter. The delayed high-to-low transition signal turns on transistor 331 and provides a current path through transistor 329 and resistor 345 for charging capacitor 337. This charging of capacitor 337 delays the low-to-high transition of the signal on lead 347 applied to NAND gate 349. This first delay of resistor 313 and capacitor 315 in combination with the second delay of resistor 345 and capacitor 337 is preferably 100 nanoseconds. Thus, the additional delay of a high-to-low transition from clock input signal CLK to clock control signal *CLK 374 is increased by preferably 98 nanoseconds for a high level of control signal DFT 351. This increased delay is much greater than the preferred 4 nanosecond pulse width of clock pulse signal IOCLK. Delay circuit 300, therefore, provides a single clock pulse signal for control of internal circuit operation even when subjected to extreme noise is superimposed on clock input signal CLK as in FIG. 4. This highly effective noise rejection circuit of the present invention eliminates test failures by preventing erroneous clock input signal transitions from affecting internal circuit operation.

Although the invention has been described in detail with reference to its preferred embodiment, it is to be understood that this description is by way of example only and is not to be construed in a limiting sense. For example, the noise suppression circuit in the clock input buffer of the present invention may be applied to any control signal input buffer. Moreover, the inventive concept of the present invention is not limited to design-for-test operation but is equally applicable to normal circuit operation.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
    a delay circuit coupled to receive a clock input signal having first and second transitions and a control signal, the control signal having a first logic state and a second logic state, the delay circuit producing a first transition of a clock control signal at a first time after the first transition of the clock input signal in response to the first logic state, the delay circuit producing the first transition of the clock control signal at a second time different than the first time after the first transition of the clock input signal in response to the second logic state; and
    a clock circuit coupled to receive the clock input signal and the clock control signal, the clock circuit producing a first transition of a clock output signal in response to the first transition of the clock input signal, the clock circuit producing a second transition of the clock output signal in response to the first transition of the clock output signal.

2. A circuit as in claim 1, wherein the control signal is a test signal.

3. A circuit as in claim 1, wherein the clock output signal has a predetermined width, and wherein a difference between the first time and the second time is at least twice a time of the predetermined width.

4. A circuit as in claim 1, wherein the clock circuit produces a transition of the clock output signal two gate delays after the transition of the clock input signal.

5. A circuit as in claim 1, wherein the delay circuit is further coupled to receive a delay signal having a first logic state and a second logic state, the delay circuit producing the clock control signal at the second time in response to the first logic state of the delay signal, the delay circuit producing the clock control signal at a third time in response to the second logic state of the delay signal.

6. A circuit as in claim 5, wherein the delay signal is stored during a test mode.

7. A circuit, comprising:
    a delay circuit coupled to receive a clock input signal, the delay circuit producing a first transition of a clock control signal at a second time in response to a first transition of the clock input signal at a first time, the delay circuit producing a second transition of the clock control signal at a fourth time in response to a second transition of the clock input signal at a third time, wherein a difference between the third and fourth times is at least twice a difference between the first and second times; and
    a clock circuit coupled to receive the clock input signal and the clock control signal, the clock circuit producing a first transition of a clock output signal in response to the first transition of the clock input signal and the clock control signal, the clock circuit producing a second transition of the clock output signal in response to the first transition of the clock output signal.

8. A circuit as in claim 7, wherein the delay circuit is further coupled to receive a control signal, and wherein the difference between the third and fourth times is at least twice the difference between the first and second times for a first logic state of the control signal, and wherein the difference between the third and fourth times is substantially the same as the difference between the first and second times for a second logic state of the control signal.

9. A circuit as in claim 7, wherein the clock output signal has a predetermined width, and wherein the difference between the third and fourth times is at least twice a time of the predetermined width.

10. A circuit as in claim 7, wherein the clock circuit produces the first transition of the clock output signal two gate delays after the first transition of the clock input signal.

11. A circuit as in claim 7, wherein the delay circuit is further coupled to receive a delay signal having a first logic state and a second logic state, the delay circuit producing the clock control signal at the fourth time in response to the first logic state of the delay signal, the delay circuit producing the clock control signal at a fifth time in response to the second logic state of the delay signal.

12. A circuit as in claim 11, wherein the delay signal is stored during a test mode.

13. A circuit as in claim 7, wherein said at least twice is at least ten times.

14. A circuit as in claim 1, wherein the circuit is a clock input buffer circuit for a synchronous memory circuit.

15. A circuit as in claim 1, wherein the circuit is a clock input buffer circuit for a synchronous dynamic random access memory circuit.

16. A circuit as in claim 1, wherein the first time after the first transition is substantially equal to two gate delay times.

17. A circuit as in claim 1, wherein the second time after the first transition is equal to at least four gate delay times.

18. A circuit as in claim 3, wherein the predetermined width is determined by another delay circuit.

19. A method of testing a circuit, comprising the steps of:
    applying a first logic state of a test signal to the circuit in a first mode of operation;
    applying a first transition of a clock input signal to the circuit;
    producing a first transition of an output signal at a first time after the first transition of the clock input signal in response to the first logic state;

applying a second logic state of the test signal to the circuit in a second mode of operation;

applying the first transition of the clock input signal to the circuit;

producing the first transition of the output signal at a second time different than the first time after the first transition of the clock input signal in response to the second logic state; and producing a second transition of the output signal in response to the first transition of the output signal.

20. A method as in claim 19, comprising the steps of:

producing the first transition of the output signal in response to the first transition of the clock input signal; and not producing a second transition of the output signal in response to the second transition of the clock input signal.

21. A method as in claim 19, wherein the output signal is a pulse having a predetermined width.

22. A circuit, comprising:

a first tristate inverting circuit having a first input terminal, a first output terminal, and a first control terminal; and an inverting circuit having a second input terminal coupled to the first output terminal and having a second output terminal coupled to the first control terminal.

23. A circuit as in claim 22, comprising a second tristate inverting circuit having a third input terminal coupled to the second output terminal, a third output terminal coupled to the second input terminal, and a second control terminal coupled to the second output terminal.

24. A circuit as in claim 23, comprising a delay circuit coupled between the third input terminal and the second output terminal.

25. A circuit as in claim 22, comprising:

a delay circuit having an input terminal coupled to the first input terminal, having an output terminal, and having a control terminal; and a latch circuit having one input terminal coupled to the second output terminal, having another input terminal coupled to the output terminal of the delay circuit, and having an output terminal coupled to the first tristate inverting circuit.

26. A circuit as in claim 25, wherein the delay circuit has a delay corresponding to a control signal at the delay circuit control terminal.

27. A method of producing an output signal comprising the steps of:

receiving an input signal at a tristate inverting circuit;

producing a first transition of an output signal in response to a first transition of the input signal;

disabling the tristate inverting circuit in response to the first transition of the output signal; and producing a second transition of the output signal in response to the first transition of the output signal.

28. A method as in claim 27 comprising the steps of:

receiving a second transition of the input signal; and enabling the tristate inverting circuit at a predetermined time after the second transition of the input signal.

29. A method as in claim 28, wherein the predetermined time is determined by a control signal.

30. A method as in claim 28, wherein the predetermined time is determined by a control signal, and wherein the predetermined time has a first value corresponding to a first logic state of the control signal and a second value corresponding to a second logic state of the control signal.

* * * * *